(12) United States Patent
Fukao

(10) Patent No.: US 12,141,492 B2
(45) Date of Patent: Nov. 12, 2024

(54) PROCESS MANAGEMENT DEVICE

(71) Applicant: FUJI CORPORATION, Aichi (JP)

(72) Inventor: Kazuya Fukao, Toyota (JP)

(73) Assignee: FUJI CORPORATION, Aichi (JP)

( * ) Notice: Subject to any disclaimer, the term of this patent is extended or adjusted under 35 U.S.C. 154(b) by 0 days.

(21) Appl. No.: 18/567,042

(22) PCT Filed: Jul. 13, 2021

(86) PCT No.: PCT/JP2021/026371
§ 371 (c)(1),
(2) Date: Dec. 5, 2023

(87) PCT Pub. No.: WO2023/286178
PCT Pub. Date: Jan. 19, 2023

(65) Prior Publication Data
US 2024/0256202 A1   Aug. 1, 2024

(51) Int. Cl.
*G06F 3/14* (2006.01)

(52) U.S. Cl.
CPC ................................ *G06F 3/14* (2013.01)

(58) Field of Classification Search
CPC ........................................................ G06F 3/14
See application file for complete search history.

(56) References Cited

U.S. PATENT DOCUMENTS

| | | | | |
|---|---|---|---|---|
| 6,026,378 A * | 2/2000 | Onozaki | ............. | G06Q 10/087 705/28 |
| 2008/0098591 A1* | 5/2008 | Isoda | ................. | H05K 13/0038 29/740 |
| 2011/0302776 A1* | 12/2011 | Kato | ..................... | H05K 13/085 29/829 |
| 2015/0039115 A1* | 2/2015 | Sagara | ............. | G05B 19/41865 700/106 |

FOREIGN PATENT DOCUMENTS

JP    2001-34672 A    2/2001

OTHER PUBLICATIONS

International Search Report mailed on Oct. 5, 2021 in PCT/JP2021/026371 filed on Jul. 13, 2021, 2 pages.

* cited by examiner

*Primary Examiner* — Kenneth B Lee, Jr.
(74) *Attorney, Agent, or Firm* — Oblon, McClelland, Maier & Neustadt, L.L.P.

(57) ABSTRACT

A process management device includes a first display control section to display a plan image of a mounting-related process including multiple partial processes; a second display control section to display a progress image showing progress of the mounting-related process together with the plan image on the display for each partial process; and a third display control section to, when the progress of the mounting-related process is delayed from the plan of the mounting-related process in a case where the mounting-related process is performed based on the plan of the mounting-related process, display a delay image showing the delay of the progress of the mounting-related process from the plan of the mounting-related process in association with the partial process in which the delay occurs in the mounting-related process, together with the plan image on the display.

3 Claims, 4 Drawing Sheets

PROCESS MANAGEMENT DEVICE

TECHNICAL FIELD

The technique disclosed in the present description relates to a process management device for managing a mounting-related process for a mounting device to mount a component on a board.

BACKGROUND ART

There is known a process management device for managing progress of whether a mounting-related process including multiple partial processes is performed as planned. For example, Patent Literature 1 discloses a device that performs work variation prediction processing of comparing a work plan and a work record in current work and predicting a process in which a delay occurs from the work plan in subsequent work in a steelmaking process of steel industry.

PATENT LITERATURE

Patent Literature 1: JP-A-2001-34672

BRIEF SUMMARY OF THE INVENTION

Technical Problem

Even in a case where the mounting-related process is performed, the progress of the mounting-related process may be delayed from the plan. For example, it is assumed that the technique of Patent Literature 1 is adopted in the mounting-related process. In this case, only a partial process in which the delay occurs in the subsequent work is predicted, and it is not possible to know which partial process has the delay during the current work.

The present description provides a technique for notifying of a partial process in which a delay occurs in a case where a mounting-related process is performed based on a plan.

Solution to Problem

A process management device disclosed in the present description includes a display, a first display control section configured to display a plan image showing a plan of a mounting-related process that is for a mounting device to mount a component on a board and that includes multiple partial processes, on the display for each partial process, a second display control section configured to, in a case where the mounting-related process is performed based on the plan of the mounting-related process, display a progress image showing progress of the mounting-related process together with the plan image on the display for each partial process, and a third display control section configured to, when the progress of the mounting-related process is delayed from the plan of the mounting-related process in a case where the mounting-related process is performed based on the plan of the mounting-related process, display a delay image showing the delay of the progress of the mounting-related process from the plan of the mounting-related process in association with the partial process in which the delay occurs in the mounting-related process, together with the plan image on the display.

With such a configuration, in a case where the mounting-related process is performed based on the plan, the delay image showing the delay of the progress of the mounting-related process from the plan of the mounting-related process is displayed together with the plan image showing the plan of the mounting-related process, in association with the partial process in which the delay occurs. The delay image enables the notification of the partial process in which the delay occurs.

DESCRIPTION OF EMBODIMENTS

Figure 1:
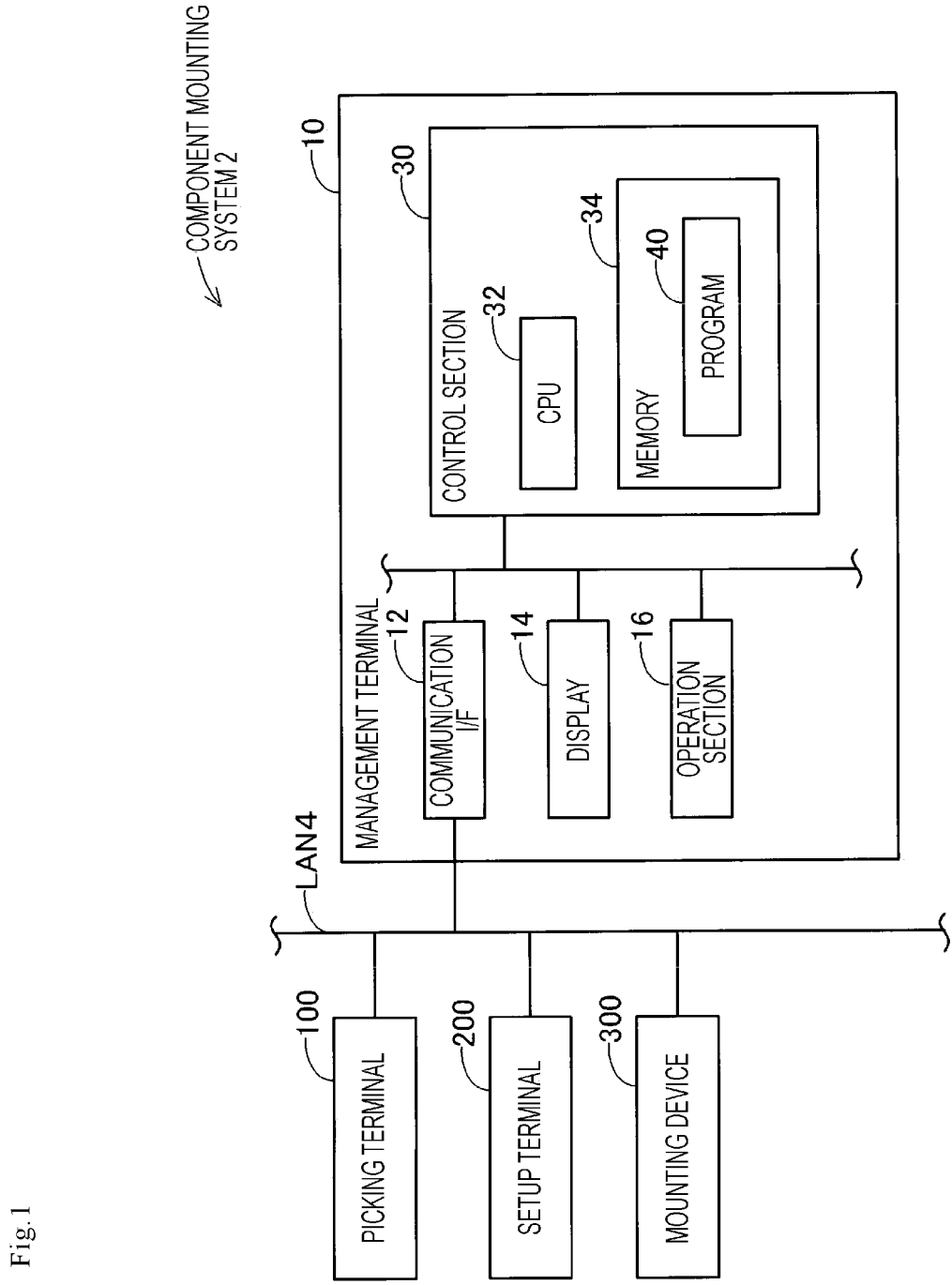
FIG. 1 is a diagram illustrating a component mounting system according to each example.

Main features of examples described below are listed below. Technical elements described below are independent technical elements, respectively, exhibit technical usefulness alone or by various combinations, and are not limited to the combinations disclosed in the claims as originally filed.

(Feature 1)

The third display control section may be configured to display the delay image in association with a first partial plan image showing a plan of a first partial process in which the delay occurs on the display. With such a configuration, a user who views the first partial plan image can know that the delay occurs in the progress of the first partial process.

(Feature 2)

The first display control section may be configured to display the first partial plan image and a second partial plan image showing a plan of a second partial process, which is a next process of the first partial process, side by side along a time axis on the display, the third display control section may be configured to arrange and display the delay image between the first partial plan image and the second partial plan image on the display, and the first display control section may be configured to arrange and display the second partial plan image at a position delayed by time shown by the delay image on the display.

For example, in a case where the progress of the first partial process is delayed, an image showing the progress of the second partial process (hereinafter, referred to as a "second partial progress image") is arranged at a position delayed by the delay of the progress of the first partial process. For example, in a situation in which the progress of the first partial process is delayed, a comparative example is assumed in which the second partial plan image is arranged at a position as originally planned. In this comparative example, the start time of the second partial progress image appears to be delayed by the delay of the progress of the first partial process from the start time of the second partial plan image. For example, a specific case is assumed in which the start time of the second partial process is delayed due to the delay of the end time of the first partial process, but the second partial process is in progress as planned. In this case, there is a possibility that the user erroneously recognizes that the progress of the second partial process is delayed from the plan by viewing the second partial progress image that appears to be delayed. In contrast, with the configuration described above, the second partial plan image is arranged at the position delayed by the delay of the progress of the first partial process. Therefore, the start time of the second partial progress image and the start time of the second partial plan image appear to be aligned. For example, in the specific case described above, since the start time of the second partial progress image and the start time of the second partial plan image are aligned, it is possible to suppress erroneous recognition of the user that the progress of the second partial process is delayed from the plan.

First Example (Component Mounting System 2: FIG. 1)

As illustrated in FIG. 1, component mounting system 2 includes management terminal 10, picking terminal 100, setup terminal 200, and mounting device 300. Each of devices 10, 100, 200, and 300 is connected to local area network 4 (hereinafter referred to as "LAN 4"). Devices 10, 100, 200, and 300 can communicate with each other via LAN 4. Management terminal 10, picking terminal 100, and setup terminal 200 are terminal devices, such as desktop PC, notebook PC, a tablet terminal, a smartphone, and a handy terminal. Mounting device 300 is a device for mounting an electronic component on a board. Specifically, mounting device 300 includes a cassette to which a component feeder that accommodates multiple electronic components can be attached, a conveyance device that conveys the board into mounting device 300, and a mounting unit that mounts the electronic component supplied from the component feeder on the board conveyed by the conveyance device.

Picking terminal 100 is a terminal device operated by a picking operator. The picking operator picks (collects) the component (that is, the board and the component feeder) used in mounting device 300 from a warehouse in which the stock of the board and the component feeder is managed. A process performed by the picking operator is hereinafter referred to as a "picking process". The picking process includes an operation of reading a code (for example, a barcode) for identifying each component in the warehouse by picking terminal 100. In a modification example, the picking process may be performed by a robot, in addition to the picking operator. In this case, a control device that controls the robot may function as the picking terminal.

Setup terminal 200 is a terminal device operated by an external setup operator. The external setup operator conveys the component picked in the picking process to the periphery of mounting device 300, and performs the external setup of arranging the component at a predetermined position in the periphery of mounting device 300. A process performed by the external setup operator is hereinafter referred to as an "external setup process". In a modification example, the external setup process may be performed by a robot, in addition to the external setup operator. In this case, a control device that controls the robot may function as the setup terminal.

Management terminal 10 is a terminal device for creating plan data showing a plan of a mounting-related process for mounting device 300 to mount the electronic component on the board and managing the progress of the mounting-related process. The mounting-related process includes an internal setup process and a production process, in addition to the picking process and the external setup process. The internal setup process is a process in which an internal setup operator attaches the component arranged at a predetermined position in the external setup process to the conveyance device and the cassette of mounting device 300. The component in the cassette attached to mounting device 300 in the internal setup process is mounted on the board by mounting device 300 in the production process. In a modification example, the internal setup process may be performed by a robot, in addition to the internal setup operator. In this case, management terminal 10 may function as a control device that controls the robot.

Management terminal 10 includes communication interface 12, display 14, operation section 16, and control section 30. Hereinafter, the "interface" is abbreviated as "I/F".

Communication I/F 12 is I/F for executing communication via LAN 4, and is connected to LAN 4. Display 14 displays various types of information. Operation section 16 includes multiple keys (for example, a keyboard) that receive an instruction from the user. Display 14 may function as a touch screen (that is, operation section 16) for receiving an instruction from the user.

Control section 30 includes CPU 32 and memory 34. CPU 32 executes various types of processing in accordance with program 40 stored in memory 34. Memory 34 is configured with a volatile memory, a nonvolatile memory, or the like. Program 40 is an application program for executing the creation of the mounting-related process and the management of the progress thereof. Program 40 is provided by, for example, a vendor of mounting device 300, and is installed in management terminal 10 by the user of management terminal 10.

Figure 2:
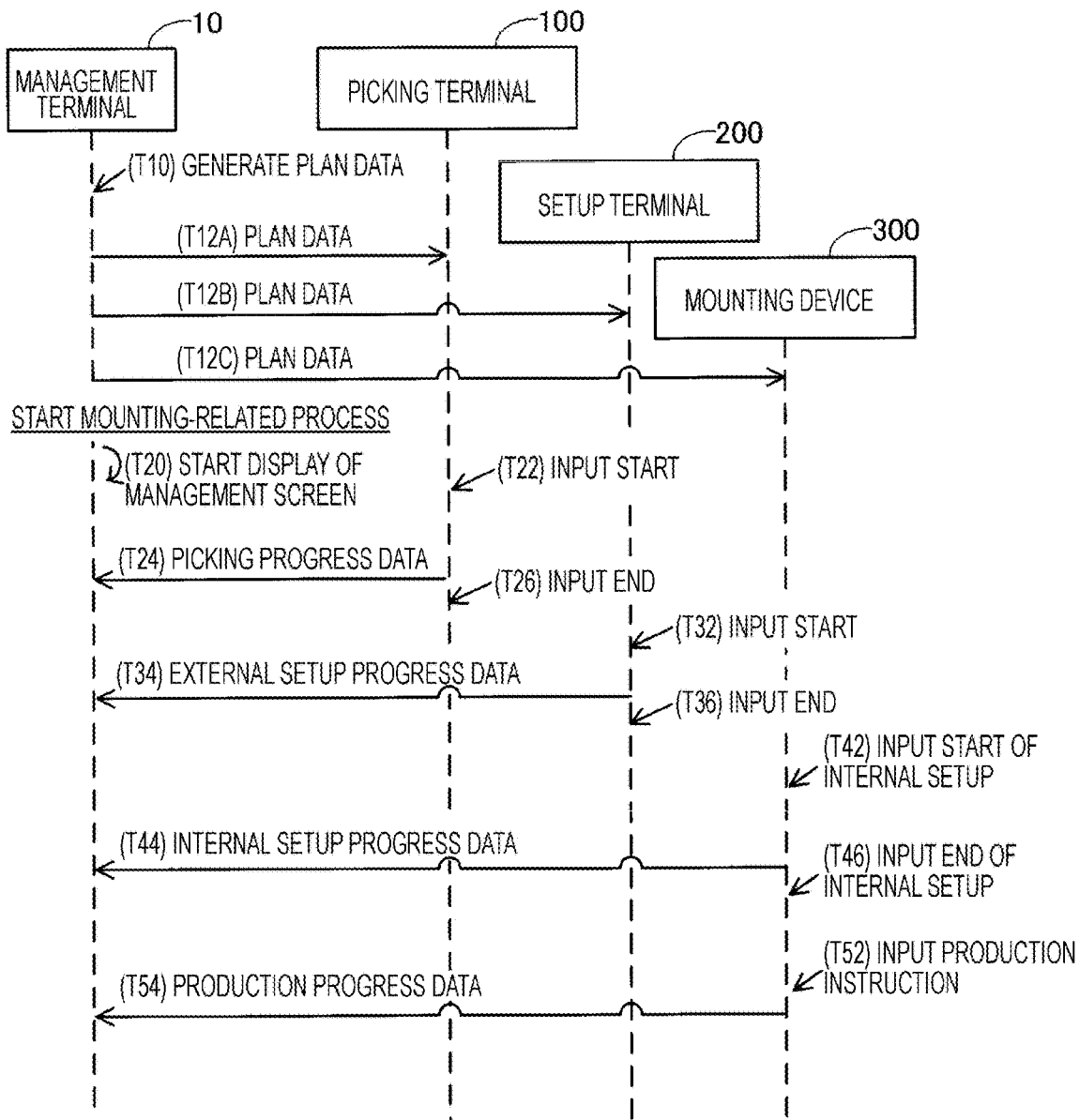
FIG. 2 is a sequence diagram illustrating processing of managing a mounting-related process.
Figure 3:
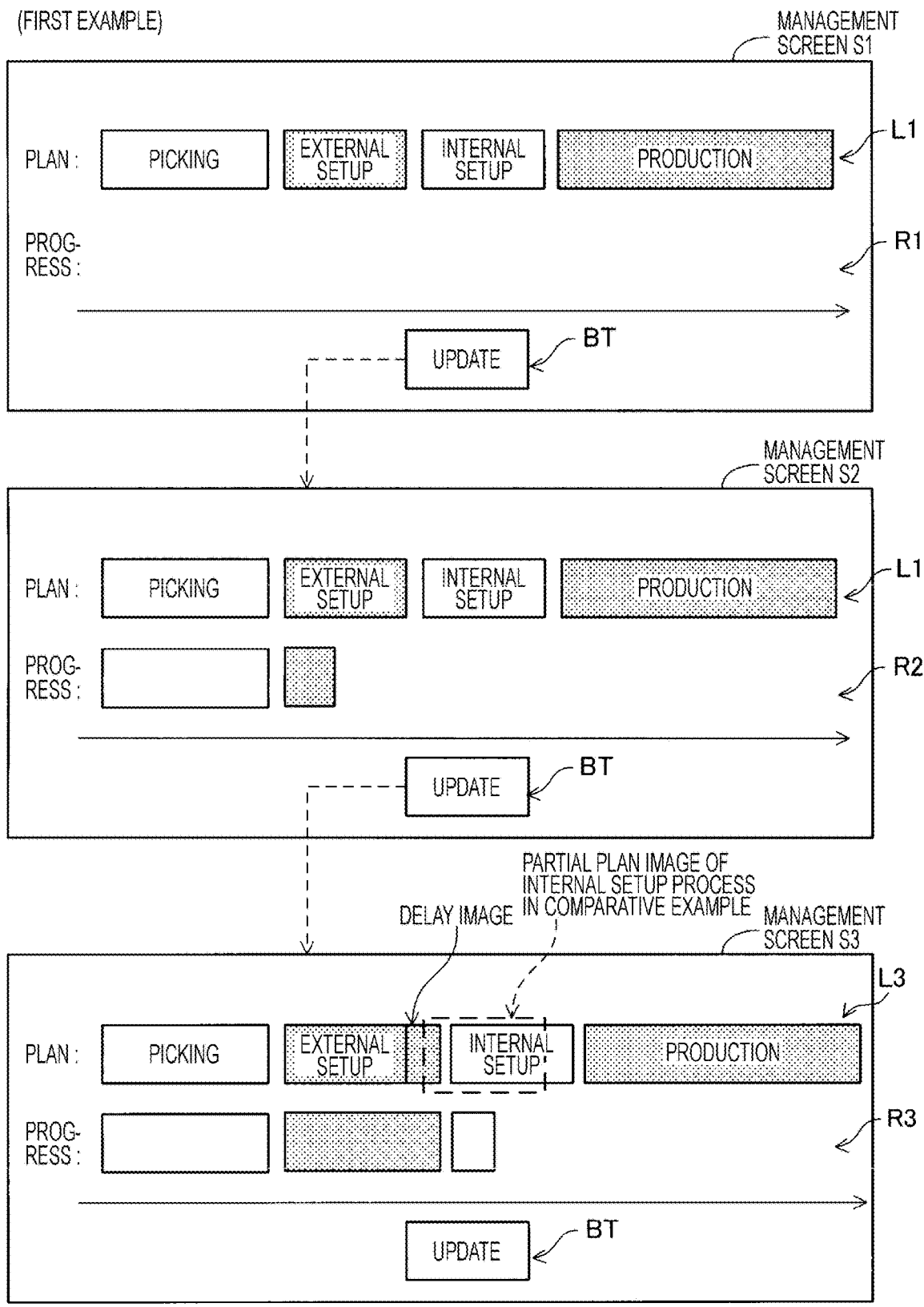
FIG. 3 is a diagram illustrating a management screen according to a first example.

(Processing of Managing Mounting-Related Process: FIGS. 2 and 3)

The processing of FIG. 2 is achieved by component mounting system 2. In the following description, the processing executed by each CPU of each device (for example, CPU 32 of management terminal 10) will not be described mainly by each CPU, but will be described mainly by each device (for example, management terminal 10) from the viewpoint of ease of understanding. Hereinafter, communication is executed between management terminal 10 and another device (for example, picking terminal 100) via LAN 4 and communication I/F 12. Hereinafter, unless otherwise specified, the description "via LAN 4" and "via communication I/F 12" will be omitted.

The user activates program 40 by operating operation section 16 of management terminal 10. At T10, the user generates the plan data using a graphical user interface displayed in accordance with program 40 and operation section 16. The plan data is data showing the plan of the mounting-related process related to one type of production target (board on which the component is mounted (that is, a circuit board)). The plan data includes the start time and the end time for each process (for example, the picking process) in the mounting-related process. In a modification example, the plan data showing the plan of the mounting-related process related to multiple types of production targets may be generated.

In T12A to T12C, management terminal 10 transmits the plan data (hereinafter, referred to as "target plan data") generated at T10 to picking terminal 100, setup terminal 200, and mounting device 300. As a result, each of devices 100, 200, and 300 displays a screen showing the plan of the mounting-related process shown by the target plan data.

In the present case, the user starts the mounting-related process based on the plan shown by the target plan data. In T20, the user operates operation section 16 of management terminal 10 to display a management screen (for example, S1 in FIG. 3) for managing the mounting-related process on display 14. Although details will be described later, management terminal 10 receives progress data from each of devices 100, 200, and 300 after displaying the management screen, and displays a progress image shown by the progress data in the management screen. The progress data is data showing the progress of the mounting-related process.

Management screen S1 of FIG. 3 shows the management screen immediately after the mounting-related process is started. Management screen S1 includes plan image L1 showing the plan of the mounting-related process shown by the target plan data, progress image R1 showing the progress of the mounting-related process, and update button BT.

Plan image L1 includes four partial plan images. The four partial plan images include a partial plan image of the picking process, a partial plan image of the external setup process, a partial plan image of the internal setup process, and a partial plan image of the production process. The four partial plan images are arranged side by side along a time axis in the order of the picking process, the external setup process, the internal setup process, and the production process. For example, the partial plan image showing the picking process is a rectangle, a left end side of the rectangle indicates the start time of the picking process, and a right end side of the rectangle indicates the end time of the picking process.

At timing when management screen S1 is displayed, the first picking process has not yet been started. Therefore, progress image R1 in management screen S1 is a blank image.

Update button BT is a button for updating the image (that is, the plan image and the progress image) in the management screen. When update button BT is selected, management terminal 10 updates the image in the management screen based on the progress data received from each of devices 100, 200, and 300. In a modification example, management screen S1 need not include update button BT. In this case, management terminal 10 may periodically and automatically update the image in the management screen based on the received progress data.

Returning to FIG. 2, the description is continued. In the present case, the user of management terminal 10 transmits an instruction to start the mounting-related process to the picking operator. At T22, the picking operator operates picking terminal 100 to input information indicating the start of the picking process to picking terminal 100.

At T24, picking terminal 100 periodically transmits picking progress data showing the progress of the picking process to management terminal 10. The picking progress data includes elapsed time from the start of T22. In a modification example, picking terminal 100 may transmit the picking progress data to management terminal 10 every time the picking operator picks individual component.

When the picking process ends, the picking operator operates the picking terminal to input information indicating the end of the picking process to picking terminal 100 at T26. As a result, picking terminal 100 transmits end data showing the end of the picking process to management terminal 10. When scheduled start time of the external setup process comes after the end data is received from picking terminal 100, management terminal 10 notifies the external setup operator of the start of the external setup process. For example, management terminal 10 transmits notification indicating the start of the external setup process to setup terminal 200.

At T32, the external setup operator operates setup terminal 200 to input information indicating the start of the external setup process to setup terminal 200.

At T34, setup terminal 200 periodically transmits external setup progress data showing the progress of the external setup process to management terminal 10. The external setup progress data includes elapsed time from the start of T32. In a modification example, setup terminal 200 may transmit the external setup progress data to management terminal 10 every time the external setup operator terminates each process in the external setup process.

In the present case, the user of management terminal 10 selects update button BT in management screen S1 during the performance of the external setup process. As a result, management terminal 10 displays management screen S2 illustrated in FIG. 3 on display 14.

Management screen S2 is the same as management screen S1 except that progress image R2 updated from progress image R1 in management screen S1 is included. Progress image R2 includes a partial progress image showing the progress of the picking process and a partial progress image showing the progress of the external setup process. Similarly to the partial plan image, the partial progress image is a rectangle, and a left end side of the rectangle indicates start time of the process shown by the partial progress image, and a right end side of the rectangle indicates a progress status (that is, elapsed time from the start time) of the process.

In the present case, there is no delay in the progress of the picking process from the plan of the picking process shown by the target plan data. Therefore, in management screen S2, the start time of the partial plan image of the picking process and the start time of the partial progress image of the picking process are aligned on the time axis. Further, in management screen S2, the end time of the partial plan image of the picking process and the end time of the partial progress image of the picking process are aligned on the time axis. In the present case, the external setup process is started as planned. Therefore, in management screen S2, the start time of the partial plan image of the external setup process and the start time of the partial progress image of the external setup process are aligned on the time axis. Since the external setup process is in the middle of the performance at the present time, the right end side of the partial progress image of the external setup process in management screen S2 indicates time before the right end side of the partial plan image of the external setup process.

Returning to FIG. 2, the description is continued. In the present case, the progress of the external setup process is delayed from the plan shown by the target plan data. When the external setup process by the external setup operator ends, setup terminal 200 is operated at T36 to input information indicating the end of the external setup process to setup terminal 200. As a result, setup terminal 200 transmits end data showing the end of the external setup process to management terminal 10. Then, when the scheduled start time of the internal setup process comes after the end data is received from setup terminal 200, management terminal 10 notifies the internal setup operator of the start of the internal setup process. For example, management terminal 10 transmits notification indicating the start of the internal setup process to setup terminal 200.

At T42, the internal setup operator operates mounting device 300 to input information indicating the start of the internal setup process to mounting device 300.

In T44, mounting device 300 periodically transmits internal setup progress data showing the progress of the internal setup process to management terminal 10. The internal setup progress data includes elapsed time from the start of T42. In a modification example, mounting device 300 may transmit the internal setup progress data to management terminal 10 every time the internal setup operator terminates each process in the internal setup process.

When the internal setup process ends, the internal setup operator operates mounting device 300 at T46 to input information indicating the end of the internal setup process to mounting device 300.

In the present case, the internal setup operator operates mounting device 300 at T52 to input information indicating the start of the production process to mounting device 300.

At T54, mounting device 300 periodically transmits production progress data showing the progress of the production process to management terminal 10. The production progress data includes elapsed time from the start of T52.

In the present case, the user of management terminal 10 selects update button BT in management screen S2 during the performance of the internal setup process. As a result, management terminal 10 displays management screen S3 illustrated in FIG. 3 on display 14.

Management screen S3 is the same as management screen S2 except that progress image R3 updated from progress image R2 in management screen S2 and plan image L3 updated from plan image L1 in management screen S2 are included. Progress image R3 is the same as progress image R3 in management screen S2 except that a right end side of the partial progress image of the external setup process extends to a position indicating the end time of the setup process and the partial progress image of the internal setup process is added.

Plan image L3 is the same as plan image L1 except that a delay image is added and both the partial plan image of the internal setup process and the partial plan image of the production process are arranged at positions delayed by the time shown by the delay image. Here, the delay image shows time of the delay of the progress of the external setup process from the plan of the external setup process. As illustrated in FIG. 3, the delay image is arranged between the partial plan image of the external setup process and the partial plan image of the internal setup process. The delay image is a rectangle, and a width of the rectangle along the time axis indicates the time of the delay of the progress from the plan. In the present case, a left end side of the delay image is the right end side of the partial plan image of the external setup process, and a right end side of the delay image shows the end time of the delayed external setup process.

As illustrated in FIG. 3, in management screen S3, the end time of the delay image and the end time of the partial progress image of the external setup process are aligned on the time axis. The start time of the internal setup process and the start time of the partial progress image of the internal setup process are aligned on the time axis.

(Effects of Present Example)

With the configuration of the present example, in a case where the mounting-related process is performed based on the plan shown by the target plan data, the delay image showing the delay of the progress of the mounting-related process from the plan of the mounting-related process is displayed, on display 14, adjacent to the partial plan image of the external setup process in which the delay occurs in the mounting-related process (management screen S3 of FIG. 3). It is possible to notify the user that the delay occurs in the external setup process by the delay image adjacent to the external setup process. The process in which the delay occurs is not limited to the external setup process, and may be another process (for example, the picking process).

Further, for example, in a situation in which the progress of the external setup process is delayed, a comparative example is assumed in which the partial plan image of the internal setup process is arranged at a position as originally planned. In this comparative example, the start time of the partial progress image of the internal setup process appears to be delayed by the delay of the progress of the external setup process from the start time of the partial plan image of the internal setup process (see a broken line in management screen S3 in FIG. 3). For example, a specific case is assumed in which the start time of the internal setup process is delayed due to the delay of the end time of the external setup process, but the internal setup process is in progress as planned. In this case, there is a possibility that the user erroneously recognizes that the progress of the internal setup process is delayed from the plan by viewing the partial progress image of the internal setup process that appears to be delayed. In contrast, with the configuration of the present example, the partial plan image of the internal setup process is arranged at the position delayed by the delay of the progress of the external setup process. Therefore, the start time of the partial progress image of the internal setup process and the start time of the partial plan image of the internal setup process appear to be aligned. For example, in the specific case described above, since the start time of the partial progress image of the internal setup process and the start time of the partial plan image of the internal setup process are aligned, it is possible to suppress erroneous recognition of the user that the progress of the internal setup process is delayed from the plan.

(Correspondence Relationship)

Management terminal 10, display 14, and mounting device 300 are examples of a "process management device", a "display", and a "mounting device", respectively. The picking process, the external setup process, the internal setup process, and the production process are examples of "multiple partial processes". Plan image L3, progress image R3, and the delay image in management screen S3 are examples of a "plan image", a "progress image", and a "delay image", respectively. The external setup process and the internal setup process are examples of a "first partial process" and a "second partial process", respectively. The partial plan image of the external setup process in management screen S3 and the partial plan image of the internal setup process in management screen S3 are examples of a "first partial plan image" and a "second partial plan image", respectively.

Control section 30 that displays plan image L3 in management screen S3 on display 14, control section 30 that displays progress image R3 in management screen S3 on display 14, and control section 30 that displays the delay image in management screen S3 on display 14 are examples of a "first display control section", a "second display control section", and a "third display control section", respectively.

Second Example

In the present example, the mounting-related process related to multiple types of production targets is performed. Specifically, the mounting-related process includes a first partial process for producing a first production target, a second partial process for producing a second production target, and a third partial process for producing a third production target. Each of the first to third partial processes includes a picking process, an external setup process, an internal setup process, and a production process. In the modification example, each of the first to third partial processes may include at least the production process, and need not include any of the picking process, the external setup process, and the internal setup process.

Figure 4:
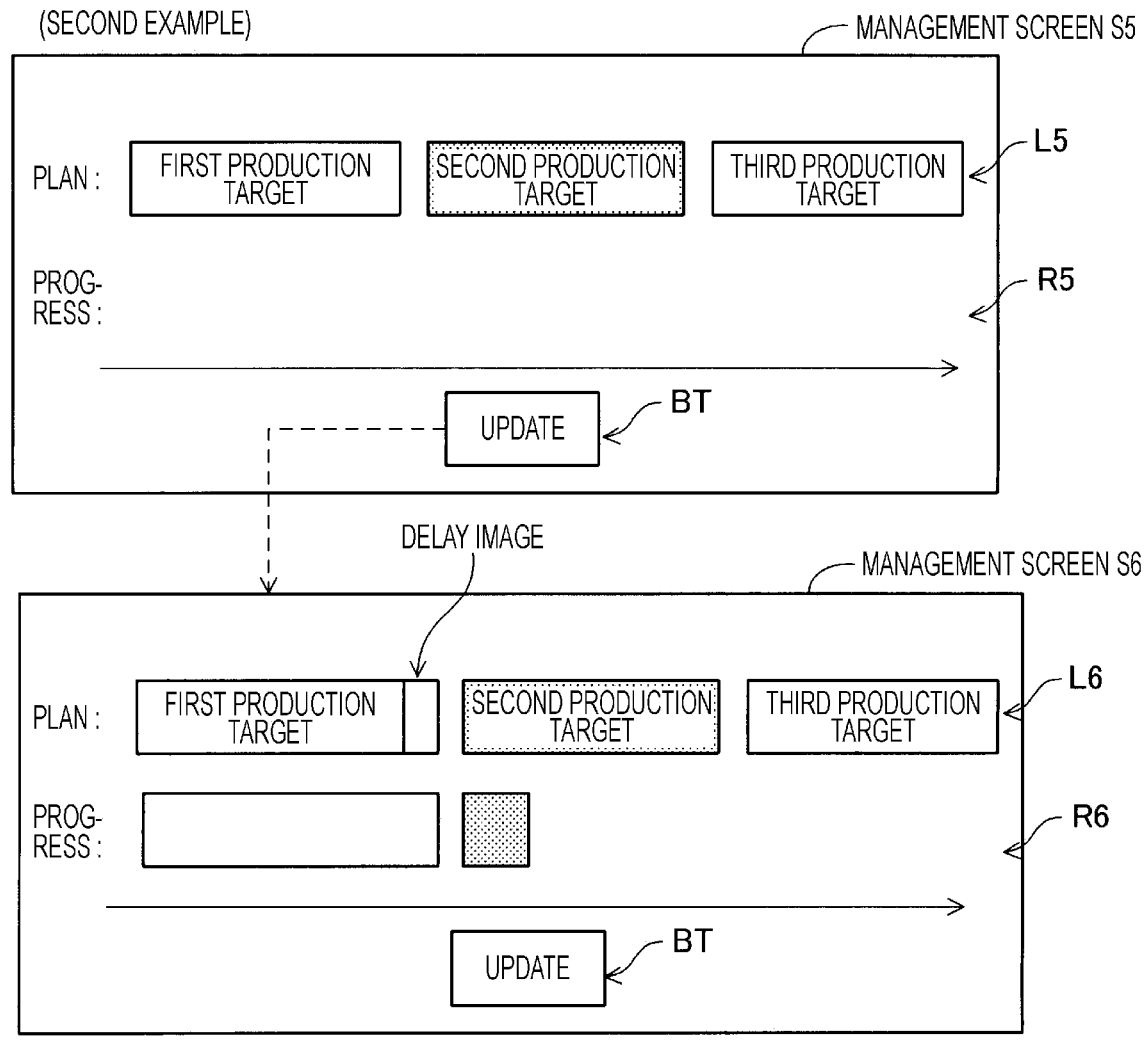
FIG. 4 is a diagram illustrating a management screen according to a second example.

Management screen S5 of FIG. 4 shows a management screen immediately after the mounting-related process is started in the present example. Management screen S5 includes plan image L5 showing the plan of the mounting-related process including the first to third partial processes, progress image R5 showing the progress of the mounting-related process, and update button BT. Since the first partial process has not yet started at the present time, progress image R5 in management screen S5 is a blank image.

Then, the user selects update button BT in management screen S5 during the performance of the second partial process of the second production target. As a result, management terminal 10 displays management screen S6 illustrated in FIG. 4 on display 14.

Management screen S6 is the same as management screen S5 except that progress image R6 updated from progress image R5 in management screen S5 and plan image L6 updated from plan image L5 in management screen S6 are included. Progress image R6 is the same as progress image R5 except that a partial progress image of the first partial process and a partial progress image of the second partial process are included.

Plan image L6 is the same as plan image L5 except that a delay image is added and both the partial plan image of the second partial process and the partial plan image of the third partial plan image are arranged at positions delayed by the time shown by the delay image. Here, the delay image shows time of the delay of the progress of the first partial process from the plan of the first partial process.

As illustrated in FIG. 4, the delay image is arranged between the partial plan image of the first partial process and the partial plan image of the second partial process. In management screen S6, the end time of the delay image and the end time of the partial progress image of the first partial process are aligned on the time axis. The start time of the second partial process and the start time of the partial progress image of the second partial process are aligned on the time axis.

Also in the present example, it is possible to notify the user that the delay occurs in the first partial process by the delay image adjacent to the first partial process. Further, since the start time of the partial progress image of the second partial process and the start time of the partial plan image of the second partial process are aligned, it is possible to suppress erroneous recognition that the progress of the second partial process is delayed from the plan.

(Correspondence Relationship)

The first to third partial processes are examples of "multiple partial processes". Plan image L6, progress image R6, and the delay image in management screen S6 are examples of a "plan image", a "progress image", and a "delay image", respectively. The first partial process of the first production target and the second partial process of the second production target are examples of a "first partial process" and a "second partial process", respectively. The partial plan image of the first partial process in management screen S6 and the partial plan image of the second partial process in management screen S6 are examples of a "first partial plan image" and a "second partial plan image", respectively.

Points to note regarding the board manufacturing system described in the example will be described. In the first example, the delay image is arranged adjacent to the partial plan image of the external setup process. Alternatively, the delay image may be arranged adjacent to the partial progress image of the external setup process. Generally speaking, the "delay image" only needs to be displayed on the display in association with the partial process in which the delay occurs (that is, at least one of the partial plan image and the partial progress image).

The delay image need not be arranged between the partial plan image of the external setup process and the partial plan image of the internal setup process. For example, the delay image may be arranged above the partial plan image of the external setup process or may be arranged to be superimposed on the partial plan image of the external setup process. In addition, in the present modification example, the partial plan image of the internal setup process may be arranged at a position as originally planned.

REFERENCE SIGNS LIST

2: component mounting system, 4: local area network, 10: management terminal, 12: communication I/F, 14: display, 16: operation section, 30: control section, 32: CPU, 34: memory, 40: program, 100: picking terminal, 200: setup terminal, 300: mounting device, S1 to S6: management screen, L1 to L6: plan image, R1 to R6: progress image, BT: update button

The invention claimed is:

1. A process management device comprising:
a display;
a first display control section configured to display a plan image showing a plan of a mounting-related process that is for a mounting device to mount a component on a board and that includes multiple partial processes, on the display for each partial process;
a second display control section configured to, in a case where the mounting-related process is performed based on the plan of the mounting-related process, display a progress image showing progress of the mounting-related process together with the plan image on the display for each partial process; and
a third display control section configured to, when the progress of the mounting-related process is delayed from the plan of the mounting-related process in a case where the mounting-related process is performed based on the plan of the mounting-related process, display a delay image showing the delay of the progress of the mounting-related process from the plan of the mounting-related process in association with the partial process in which the delay occurs in the mounting-related process, together with the plan image on the display.

2. The process management device according to claim 1, wherein the third display control section is configured to display the delay image in association with a first partial plan image showing a plan of a first partial process in which the delay occurs on the display.

3. The process management device according to claim 2, wherein the first display control section is configured to display the first partial plan image and a second partial plan image showing a plan of a second partial process, which is a next process of the first partial process, side by side along a time axis on the display,
the third display control section is configured to arrange and display the delay image between the first partial plan image and the second partial plan image on the display, and
the first display control section is configured to arrange and display the second partial plan image at a position delayed by time shown by the delay image on the display.

* * * * *